(12) United States Patent
Rud et al.

(10) Patent No.: US 8,378,872 B2
(45) Date of Patent: Feb. 19, 2013

(54) DYNAMICALLY ADJUSTED A/D RESOLUTION

(75) Inventors: Jason H. Rud, Mayer, MN (US); Andrew J. Bronczyk, Chanshassen, MN (US)

(73) Assignee: Rosemount Inc., Eden Prairie, MN (US)

( * ) Notice: Subject to any disclaimer, the term of this patent is extended or adjusted under 35 U.S.C. 154(b) by 139 days.

(21) Appl. No.: 13/077,132

(22) Filed: Mar. 31, 2011

(65) Prior Publication Data

US 2012/0250781 A1    Oct. 4, 2012

(51) Int. Cl.
    *H03M 1/12*    (2006.01)
(52) U.S. Cl. ........................................ 341/155; 341/131
(58) Field of Classification Search ........... 341/155.131, 341/139, 132
    See application file for complete search history.

(56) References Cited

U.S. PATENT DOCUMENTS

| | | | |
|---|---|---|---|
| 5,329,818 A | 7/1994 | Frick et al. ...................... 73/708 |
| 5,546,082 A | 8/1996 | LaRocca et al. .............. 341/166 |
| 5,621,406 A | 4/1997 | Goetzinger et al. ........... 341/120 |
| 5,809,879 A * | 9/1998 | Yokoyama et al. ......... 101/128.4 |
| 5,829,876 A | 11/1998 | Schwartz et al. .................. 374/1 |
| 5,876,122 A | 3/1999 | Eryurek ........................ 374/183 |
| 5,909,188 A | 6/1999 | Tetzlaff et al. ............... 341/155 |
| 6,005,500 A | 12/1999 | Gaboury et al. ................. 341/43 |
| 6,452,521 B1 | 9/2002 | Wang et al. .................... 341/139 |
| 6,577,402 B1 | 6/2003 | Miller ........................... 356/505 |
| 6,690,312 B1 | 2/2004 | Falkenberg et al. |
| 6,748,812 B1 * | 6/2004 | Takemura et al. .......... 73/861.29 |
| 6,784,820 B1 | 8/2004 | Casalegno et al. |
| 7,046,180 B2 | 5/2006 | Jongsma et al. ............... 341/141 |
| 7,228,186 B2 | 6/2007 | Karschnia et al. .............. 700/19 |
| 7,467,555 B2 | 12/2008 | Schulte et al. .................. 73/736 |
| 7,642,628 B2 | 1/2010 | Anderson et al. ............. 257/678 |
| 7,658,539 B2 | 2/2010 | Engelstad ..................... 374/163 |
| 7,903,008 B2 * | 3/2011 | Regier ........................... 341/142 |
| 8,050,501 B2 * | 11/2011 | Hirohata ....................... 382/190 |
| 8,254,180 B2 * | 8/2012 | Hoei et al. ............... 365/185.24 |
| 2004/0189498 A1 | 9/2004 | Takahashi |
| 2008/0100485 A1 | 5/2008 | Tanaka et al. |
| 2008/0259998 A1 * | 10/2008 | Venkataraman et al. ..... 374/170 |

OTHER PUBLICATIONS

First Office Action for related Chinese Application No. 201220090915.2, dated Jul. 30, 2012, 4 pages.
PCT Notification of Transmittal of the International Search Report and the Written Opinion of the International Searching Authority, or the Declaration for PCT Application No. PCT/US2012/027962, dated Aug. 30, 2012, 14 pages.

* cited by examiner

*Primary Examiner* — Peguy Jean Pierre
(74) *Attorney, Agent, or Firm* — Westman, Champlin & Kelly, P.A.

(57) ABSTRACT

A process variable transmitter is used to measure a process variable, and, in doing so, dynamically changes the resolution of the A/D converter based upon the measured value of the analog input signal. This can be done by automatically adjusting the configurable resolution gain adjustment based on the value of the analog signal being measured, by normalizing the input signal being measured so that it is centered in an optimal resolution window of the A/D converter, or by adjusting a voltage reference provided to the A/D converter.

20 Claims, 8 Drawing Sheets

DYNAMICALLY ADJUSTED A/D RESOLUTION

BACKGROUND OF THE INVENTION

The present invention relates to process variable transmitters used in process control and monitoring systems. More specifically, the present invention relates to dynamically adjusting an input to an analog-to-digital converter in such a system, in order to improve the resolution of the A/D measurement, during operation.

Process variable transmitters are used to measure process parameters in a process control or monitoring system. Microprocessor-based transmitters often include a sensor, an analog-to-digital converter for converting an output from the sensor into a digital form, a microprocessor for compensating the digitized output, and an output circuit for transmitting the compensated output. Currently, this transmission is normally done over a process control loop, such as a 4-20 mA control loop, or wirelessly.

One exemplary parameter that is measured by such a system is temperature, which is sensed by measuring the resistance of a resistive temperature device (RTD, which is also sometimes called a platinum resistance thermometer or PRT) or the voltage output by a thermocouple. Of course, temperature is only exemplary, and a wide variety of other process control parameters can be measured as well.

Some typical A/D converters are configured with a fixed voltage reference and a configurable resolution gain adjustment. Each gain setting for the configurable resolution gain adjustment corresponds to a reference point that is a scalar of the attached voltage reference. The voltage reference is used by the A/D converter to set the resolution (in volts per count) of the A/D converter. The resolution of the A/D converter can thus be changed based on an expected signal level of the analog input signal being measured.

Conventional monitoring systems, in which A/D converters are implemented, often have the configurable resolution gain adjustment set so that the A/D converter can measure the full range of a specified sensor. That is, the configurable resolution gain adjustment is set for a single, fixed resolution which can accommodate the entire sensor range. However, the actual input signal may often have a value (or vary within a range of values) for which the A/D converter could be set to a much higher resolution. Thus, setting the gain adjustment to a set, fixed resolution results in a measurement circuit that is not tuned to use the full capability of the A/D converter.

SUMMARY

A process variable transmitter is used to measure a process variable, and, in doing so, dynamically changes the resolution of the A/D converter based upon the measured value of the analog input signal. This can be done by automatically adjusting the configurable resolution gain adjustment based on the value of the analog signal being measured, by normalizing the input signal being measured so that it is centered in an optimal resolution window of the A/D converter, or by adjusting a voltage reference provided to the A/D converter.

DETAILED DESCRIPTION

Figure 1:
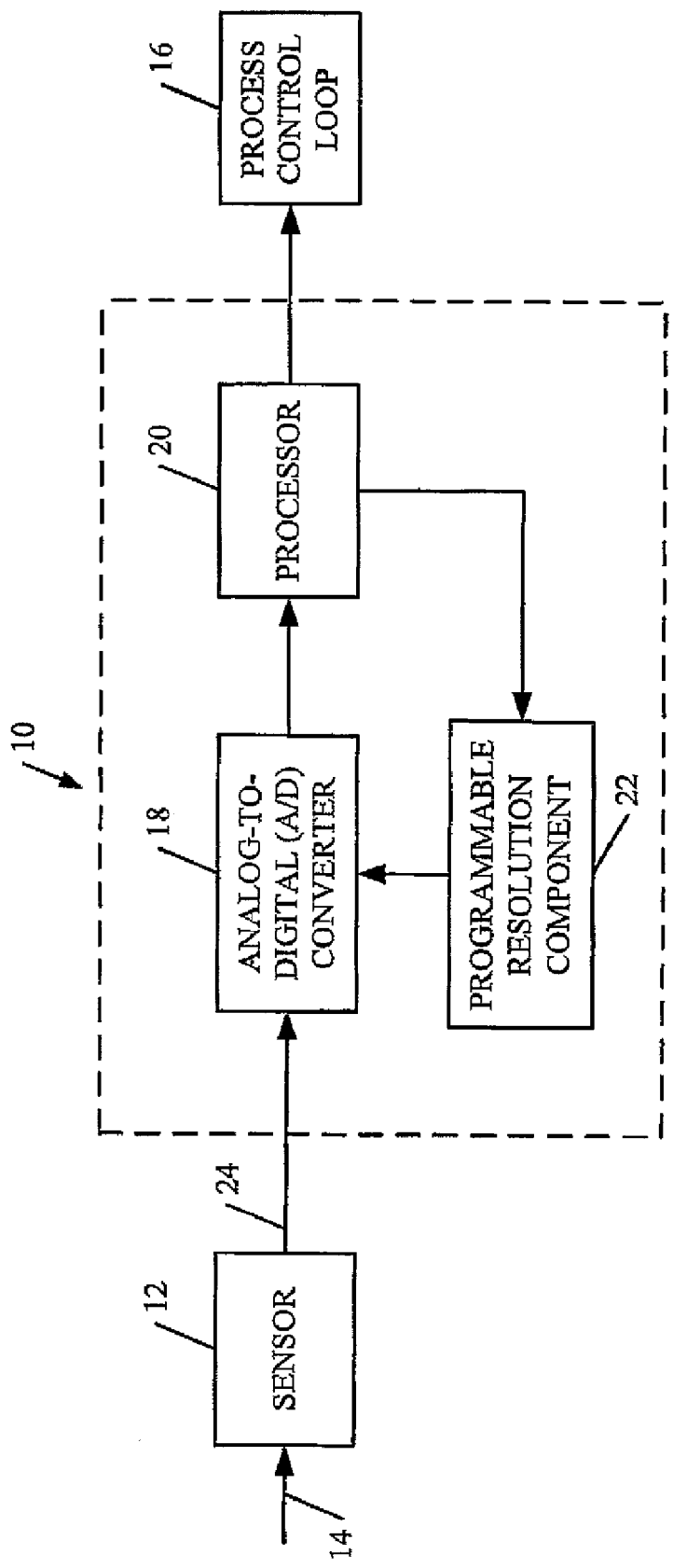
FIG. 1 is a simplified block diagram of a process variable transmitter coupled to a sensor.

FIG. 1 is a simplified block diagram of a transmitter 10 in accordance with one embodiment. Transmitter 10, in the embodiment shown in FIG. 1, includes analog-to-digital (A/D) converter 18, processor 20 and programmable resolution component 22. Transmitter 10 is shown connected to sensor 12, which senses a process control parameter indicated by arrow 14. Transmitter 10 is also shown connected to a two wire process control loop 16, but it could be connected to a wireless transmission connection instead, or in addition. In one embodiment, process control loop 16 provides power to transmitter 10. Processor 20 transmits information over process control loop 16 and receives information from other circuits or systems, over process control loop 16 as well. By way of example, process control loop 16 may illustratively be a 4-20 mA process control loop and may operate using a suitable communication protocol. Alternatively, process control loop 16 can be replaced by, or used in addition to, a wireless connection, transmitting the information wirelessly employing various wireless techniques or configurations.

Sensor 12 is illustratively a process variable sensor that receives input 14 from a process being sensed. Sensor 12 may illustratively be a sensor for sensing pressure, temperature, pH, flow, etc. Sensor 12 illustratively provides an analog output 24, indicative of the sensed parameter, to A/D converter 18.

In the present description, sensor 12 will be described as a temperature sensor. However, any other suitable sensor can be used as well, and temperature is but one example of a variable or parameter that can be sensed.

It should be noted that the output 24 from sensor 12 may illustratively be provided to a circuit (not shown) that amplifies and filters the analog sensor signal, as appropriate. This can be part of sensor 12, or a separate circuit. In any case, the amplified and filtered signal 24 is then provided to A/D converter 18. A/D converter 18 provides a digitized output to processor 20, which is a digital representation of the analog signal 24 provided by sensor 12. Processor 20, of course, illustratively has associated memory and clock circuitry, and provides information regarding the sensed parameter over process control loop 16. It should be noted that processor 20 can include an input/output (I/O) circuit, or an I/O circuit can be provided separately, that transmits information in a digital format on loop 16, or in an analog format by controlling current flow through loop 16. In any case, the information related to the sensed parameter is provided over process control loop 16 by transmitter 10.

Figure 2:
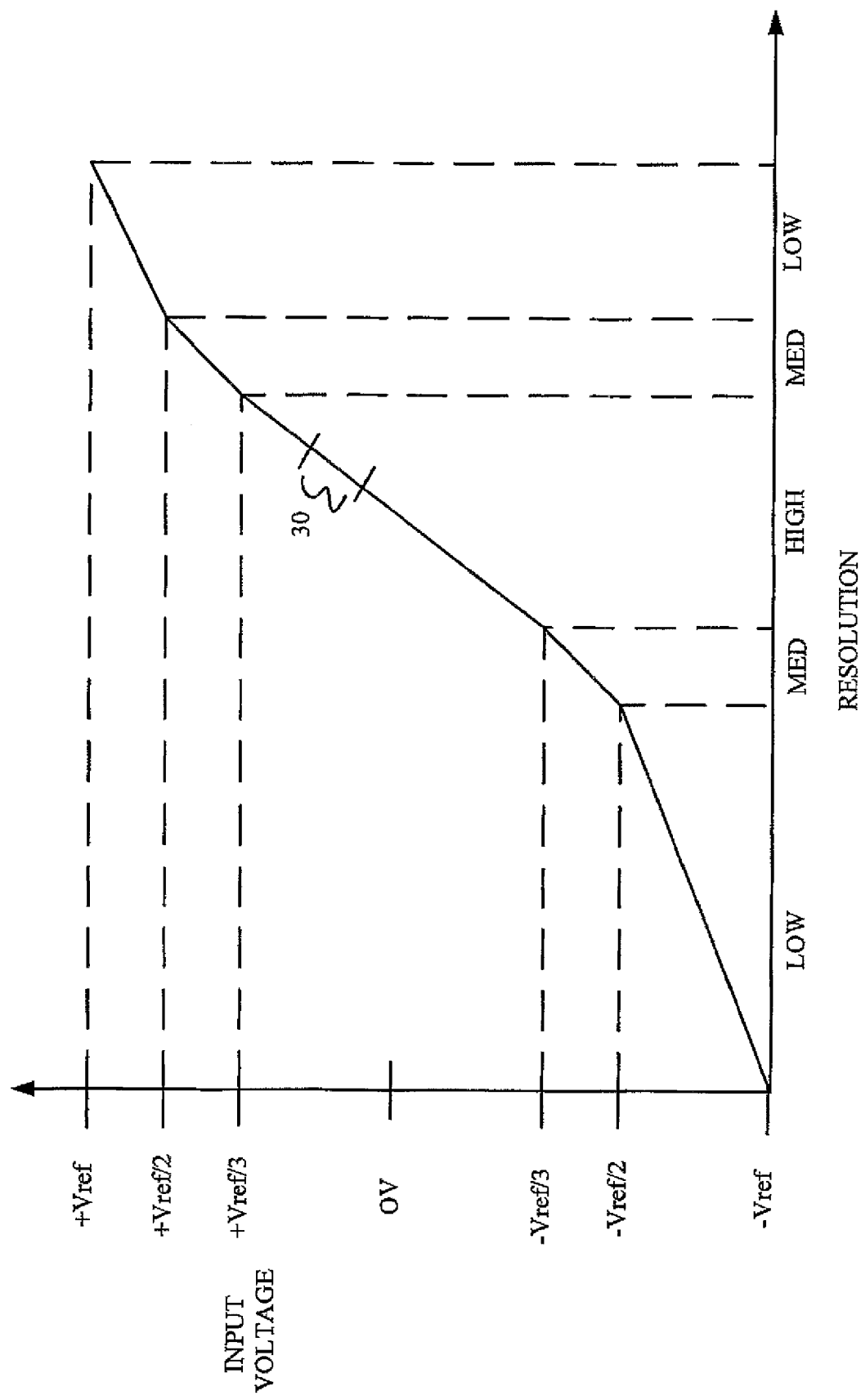
FIG. 2 is a graph of input voltage versus resolution.

FIG. 2 is a graph illustrating a relationship between input voltage relative to a reference voltage and resolution of A/D converter 18. FIG. 2 shows that A/D converter 18 can provide an output in three different resolution zones. The resolution zones include a relatively high resolution zone, a medium resolution zone (which outputs the digital value with a resolution in volts per count that is lower resolution than the high resolution zone), and a relatively low resolution zone (which outputs the digital value with a resolution that is even lower resolution than the medium resolution zone). The particular resolution zone which A/D converter 18 is capable of operating in is, in one example, based on the signal level of the analog signal 24 and its relation to a reference voltage Vref used by A/D converter 18 in making its measurements. In the exemplary embodiment shown in FIG. 2, A/D converter 18 can operate in the high resolution zone when signal 24 is between +Vref/3 and −Vref/3. A/D converter 18 can operate in the medium resolution zone when signal 24 is between +/−Vref/3 and +/−Vref/2, and A/D converter 18 can only operate in the low resolution zone when signal 24 is between +/−Vref/2 and +/−Vref. Of course, the relationship shown in FIG. 2 and the particular values of Vref/x are examples only.

In many prior systems, A/D converter 18 was configured to operate in a fixed resolution zone that could accommodate the entire specified operating range of sensor 12. That is, if sensor 12 was capable of sensing a temperature and providing an output signal 24 between −Vref and +Vref/3, then A/D converter 18 would be configured to provide its output in the lowest resolution. This would be required in order to accommodate the full specified operating range of sensor 12.

However, it may happen that sensor 12 usually operates within a much narrower range, such as range 30 identified in FIG. 2. In that case, having A/D converter 18 set to a resolution zone that is the lowest resolution zone, results in unneeded resolution errors. As device accuracy specifications are tightened, the error due to not using the maximum possible resolution setting given the input signal becomes a significant factor in total system error.

Therefore, FIG. 1 shows that transmitter 10 also includes programmable resolution component 22. Programmable resolution component 22 provides an output to A/D converter 18 that changes the resolution setting of A/D converter 18. Component 22 is controlled by processor 20 based upon the value of the measured input signal 24. Therefore, as the value of signal 24 approaches the value corresponding to a new resolution zone (shown in FIG. 2) processor 20 dynamically adjusts the resolution of A/D converter 18 to match the new resolution zone. Thus, as sensor 12 is providing an output 24 within range 30 (shown in FIG. 2) processor 20 controls component 22 to keep A/D converter 18 within the high resolution zone.

However, as the output signal 24 provided by sensor 12 approaches either of the medium resolution zones on either side of the high resolution zone (again shown in FIG. 2) processor 20 controls component 22 to dynamically adjust the resolution of A/D converter 18 so that it is in the medium resolution zone. Similarly, as signal 24 moves toward another zone, processor 20 can control component 22 to dynamically adjust the resolution of A/D converter 18 again. Thus, the resolution setting of A/D converter 18 is always in an appropriate zone (in that it matches the best resolution obtainable given the input signal 24). This increases the overall resolution with which A/D converter 18 will provide its output to processor 20, over that of a system with one, fixed resolution setting. Transmitter 10 thus takes advantage of the relatively high resolution zones of A/D convert 18, even though the entire operating range of sensor 24 includes areas outside the high resolution zone. Yet, if the measured value 24 approaches a lower resolution zone, the resolution of A/D convert 18 is simply adjusted to match that zone.

Figure 3:
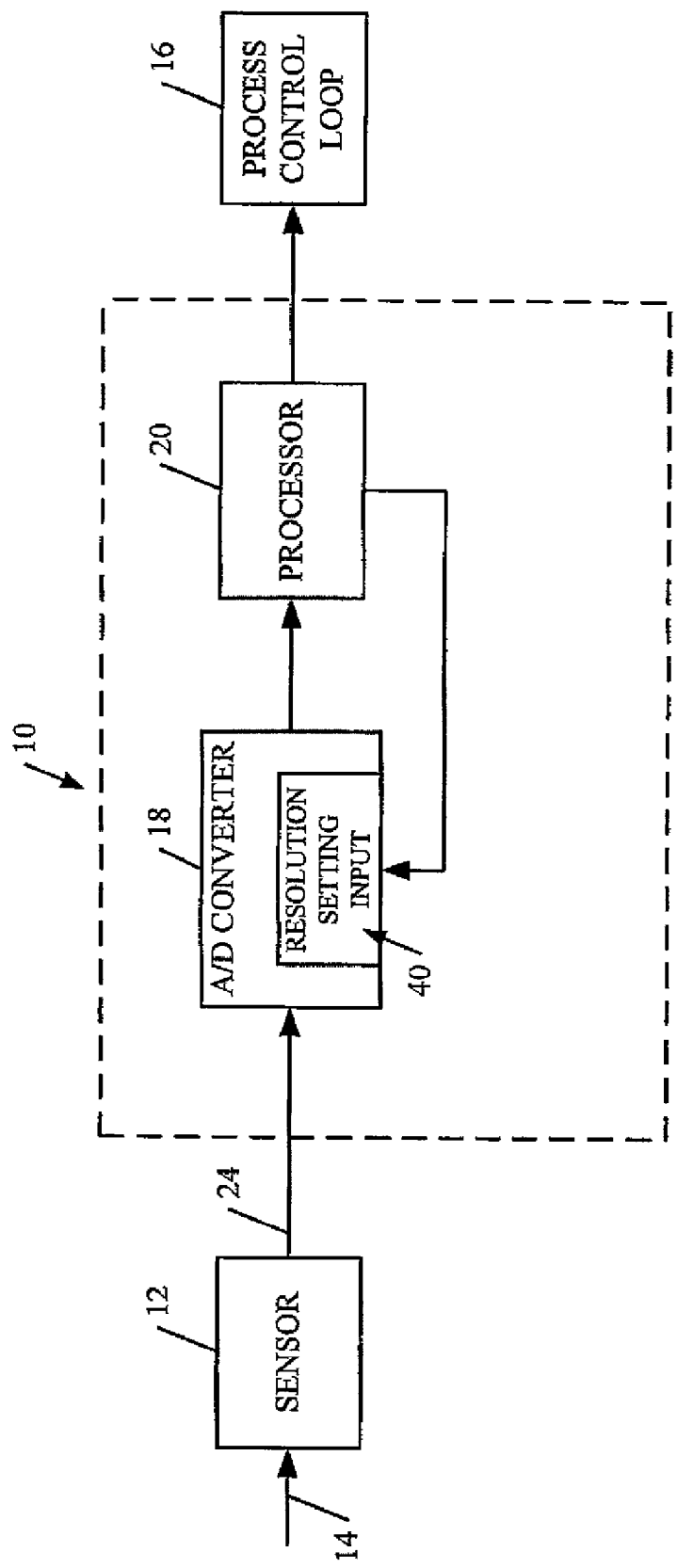
FIG. 3 is a simplified block diagram of the system shown in FIG. 1, where the A/D converter has a configurable resolution setting.

In one embodiment, processor 20 uses a window of values around each boundary between resolution zones. As signal 24 enters the window, approaching a resolution zone boundary, processor 20 can change the resolution of A/D converter 18 either ahead of time, to accommodate the new zone, or processor 20 can wait until signal 24 actually crosses the boundary before changing the resolution. In another embodiment, processor 20 may also measure a rate of change of signal 24 as it approaches a boundary and use the rate of change to determine how quickly to change resolution as well. Similarly, processor 20 may implement a hysteresis band for the transitions between different resolution settings. Therefore, if the measured sensor input signal 24 is hovering around a transition region that transitions from one resolution setting to the next, the hysteresis will keep processor 20 from continuously changing the resolution setting of A/D converter 18 in an undesirable way. The size of a given window, or hysteresis band, or the particular rate of change used, may vary with the particular implementation. Of course, other modifications can be made as well, It should be noted that, for purposes of the description of FIG. 1, programmable resolution component 22 is shown as a separate component from A/D converter 18. However, some current A/D converters 18 have component 22 incorporated therein such that processor 20 can simply provide a control output to a resolution setting input of A/D converter 18. FIG. 3 shows a simplified block diagram of such an embodiment.

The items shown in FIG. 3 are similar to those shown in FIG. 1, and similar items are similarly numbered. However, it can be seen that instead of having a separate programmable resolution component 22 that is used to change the resolution of A/D converter 18, transmitter 10 is implemented with an A/D converter 18 that simply has a resolution setting input 40. Thus, processor 20 simply provides the resolution control output, for dynamically adjusting the resolution of A/D converter 18, to resolution setting input 40 of A/D converter 18. This changes the resolution setting of A/D converter 18.

Figure 4:
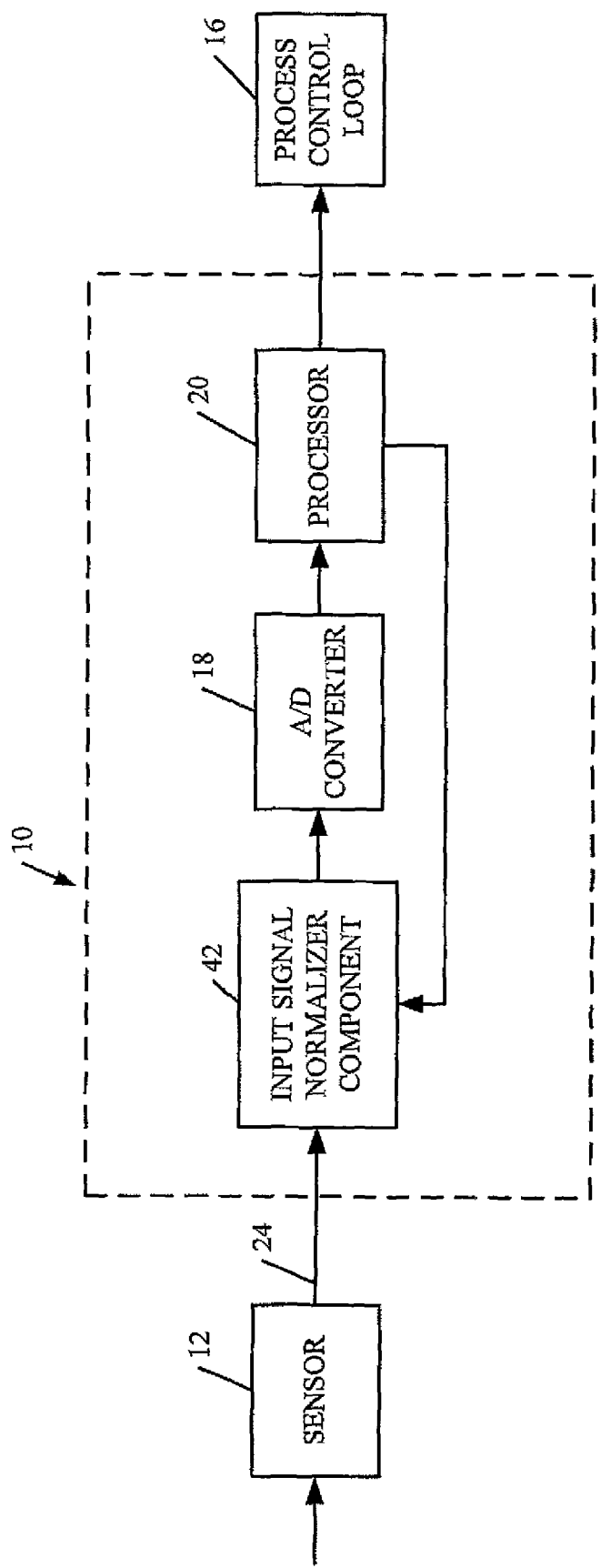
FIG. 4 is a simplified block diagram of one embodiment in which the input signal is normalized.

FIG. 4 is a simplified block diagram of another transmitter 10 in accordance with yet another embodiment. In the embodiment shown in FIG. 4, transmitter 10 includes A/D converter 18 and processor 20. However, instead of A/D converter 18 having a resolution setting input (such as 40 shown in FIG. 3), transmitter 19 includes input signal normalizer component 42.

In the embodiment shown in FIG. 4, A/D converter 18 has a high resolution zone centered around a particular input voltage measurement. For example only, it is assumed that A/D converter 18 operates with resolution zones such as those shown in FIG. 2. Therefore, as long as input signal 24 is within +/−Vref/3 then A/D converter 18 can perform its conversion in the high resolution zone, using the highest resolution obtainable by the A/D converter 18. Instead of resetting the resolution of A/D converter 18, input signal normalizer component 42 normalizes input signal 24 to illustratively keep it within the high resolution region of A/D converter 18. That is, component 42 introduces an offset into signal 24 to keep it within the high resolution zone of A/D converter 18.

Figure 5A:
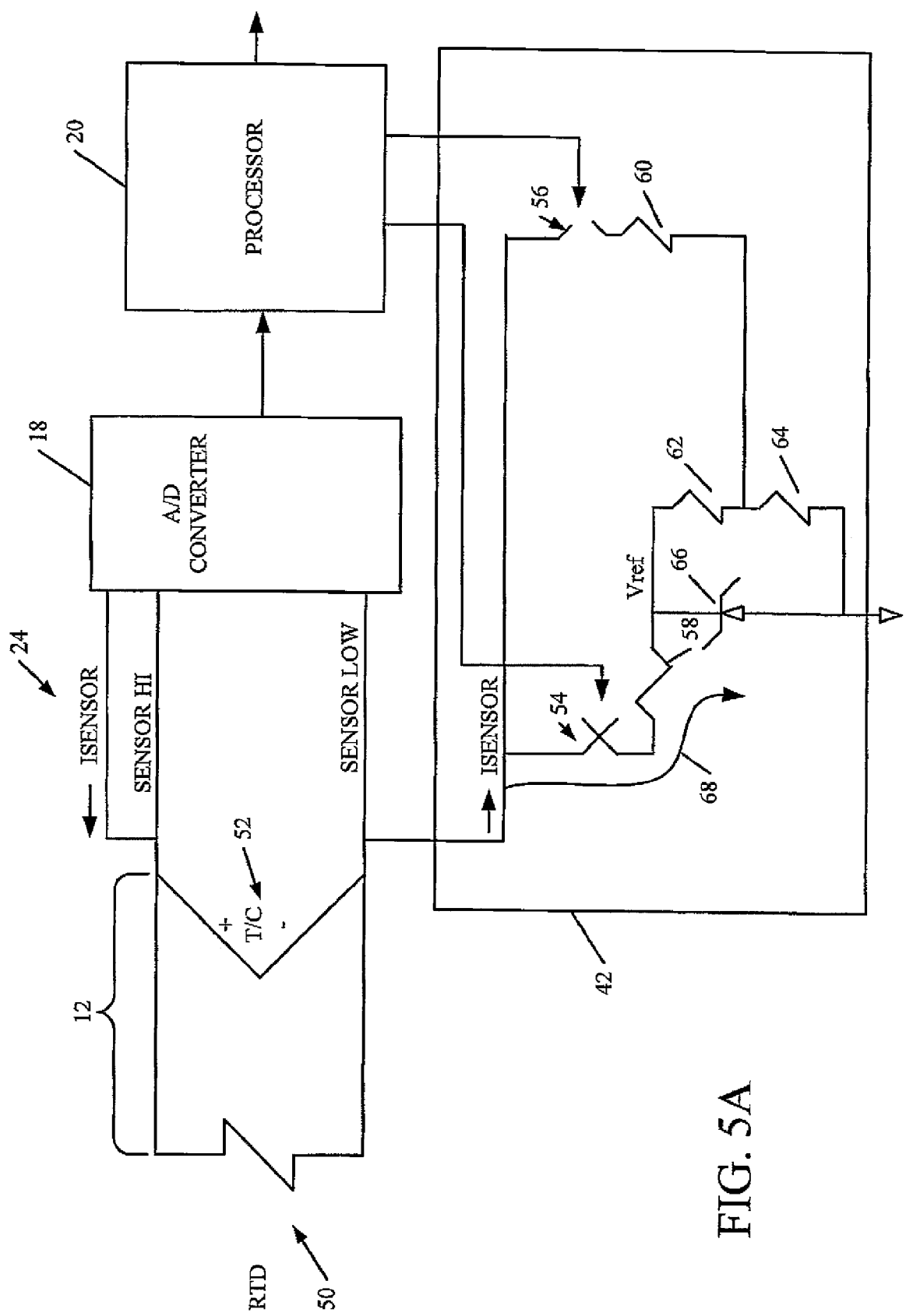
FIGS. 5A and 5B are schematic diagrams of one implementation for normalizing the input signal.

FIG. 5A is a simplified diagram showing one embodiment of input signal-normalizer component 42 in partial schematic form. FIG. 5A also shows that sensor 12 includes, by way of example, resistive thermal device (RTD) 50 or thermocouple 52. In the embodiment shown in FIG. 5A, component 42 includes a pair of switches 54 and 56 that are controlled by processor 20. Component 42 also includes a resistive network of resistors 58, 60, 62 and 64, along with Zener diode 66.

In the embodiment shown in FIG. 5A, component 42 effectively allows the zero point output by sensor 12 to be shifted down by a predetermined value. If the signal provided by sensor 12 is within an acceptable high resolution zone, then processor 20 operates switches 54 and 56 so that switch 54 is closed and switch 56 is opened, as shown in FIG. 5A. This causes sensor current $I_{sensor}$ to flow along a first path indicated by arrow 68. A/D converter 18 can perform the conversion and provide the measured, converted output to processor 20 with the highest resolution.

Figure 5B:
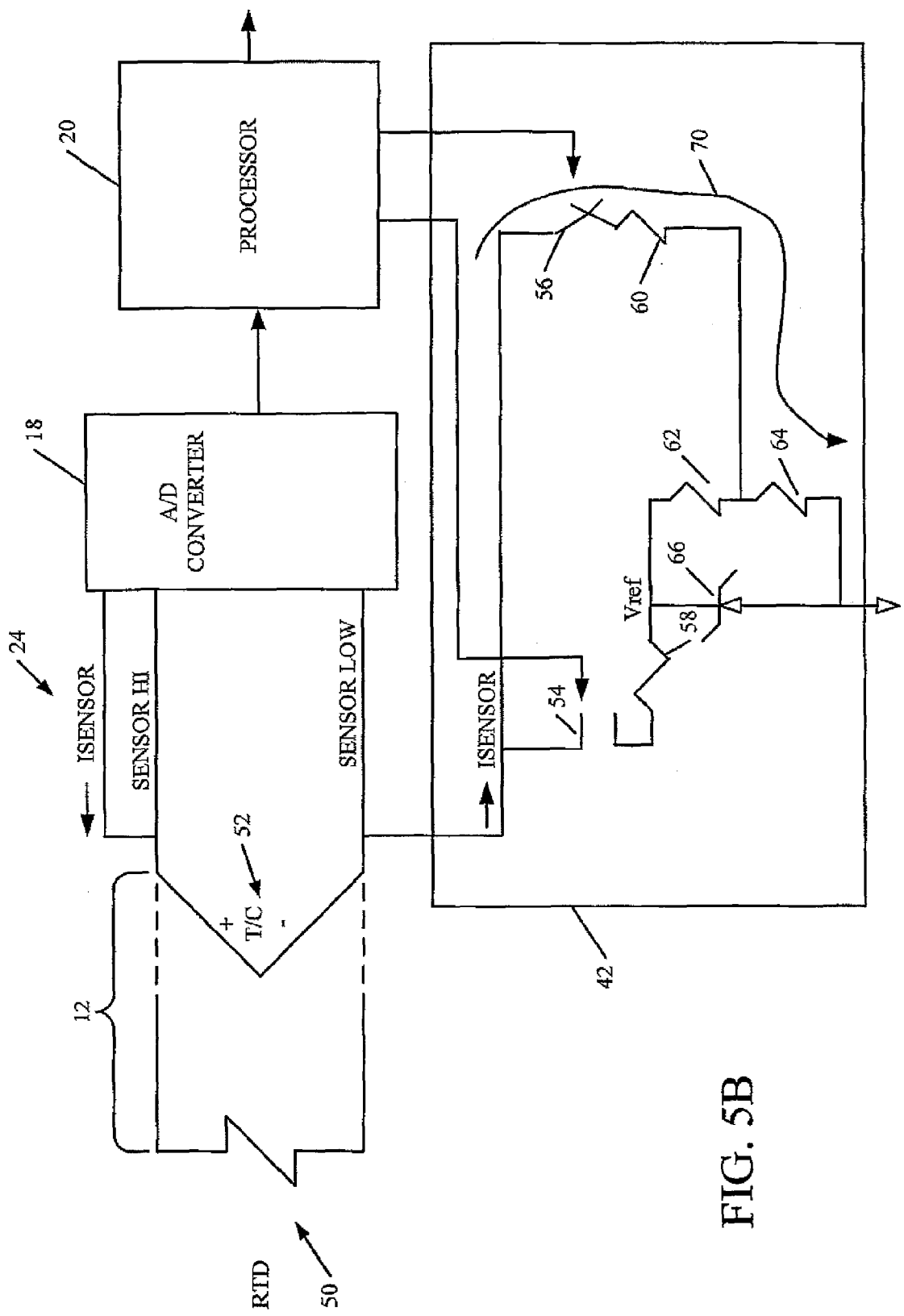

However, in the event that the signal output by sensor 12 to A/D converter 18 moves toward a lower resolution zone, then processor 20 can control switches 54 and 56 as shown in FIG. 5B, such that switch 54 is open and switch 56 is closed. This causes the current $I_{sensor}$ to flow along a second path indicated by arrow 70. This effectively lowers the sensor input 0 point such that it is within the high resolution zone voltage window as shown in FIG. 2. Of course, it will be noted that additional resistive dividers and switches can be added to accommodate other sensor ranges as well, and those shown are exemplary only.

Figure 6:
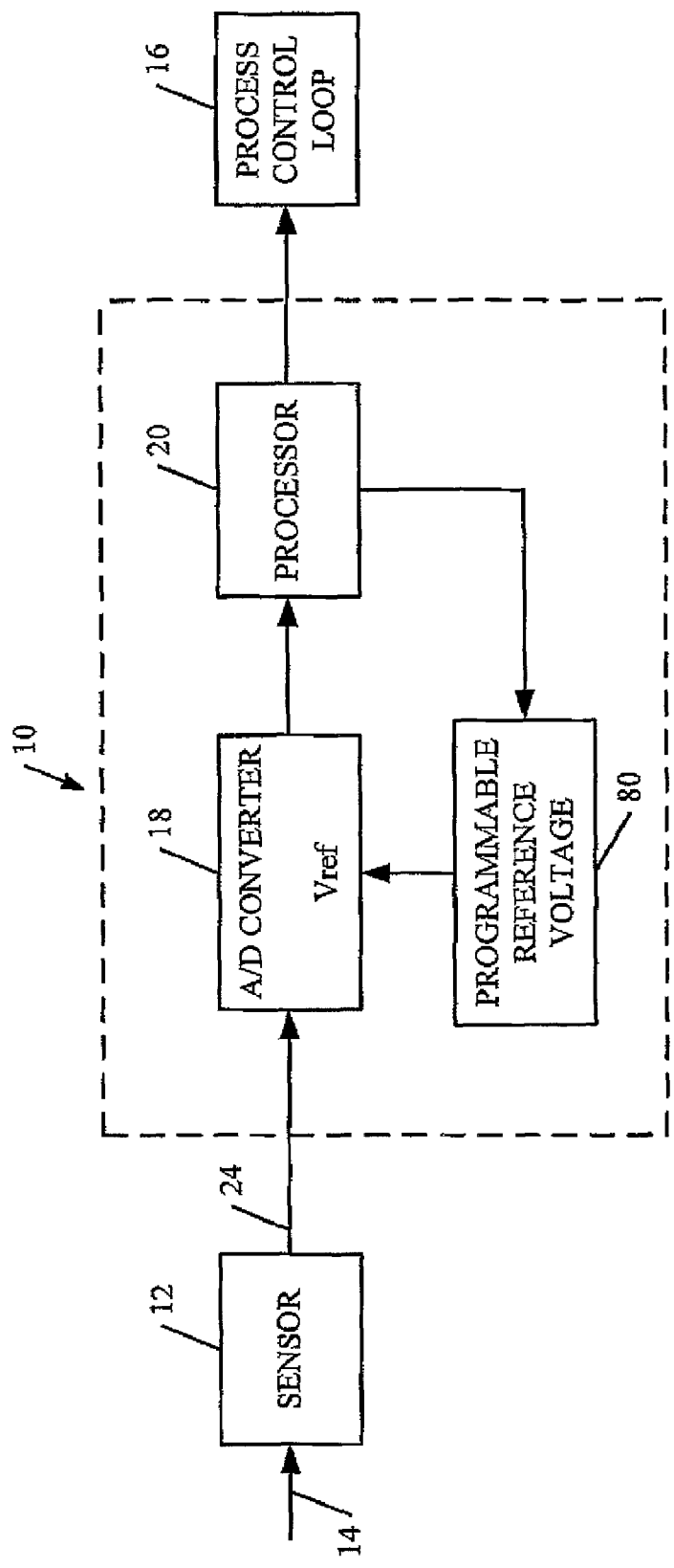
FIG. 6 is a simplified block diagram of one embodiment of dynamically changing the A/D resolution by changing the voltage reference to the A/D converter.

FIG. 6 is a simplified block diagram of yet another embodiment. In FIG. 6, similar items to those shown in previous figures are similarly numbered. FIG. 6 illustrates an embodiment in which A/D converter 18 does not provide any means to select a different resolution gain for its measurements. In that case, transmitter 10 includes programmable reference voltage 80 that provides an input to the Vref input that is used as the reference voltage in A/D converter 18 for making the A/D conversions. Processor 20 controls programmable reference voltage 80 based on the measured value of the sensor input signal 24 so that A/D converter 18 can keep operating in a relatively high resolution zone. In the embodiment, different voltage reference values provided to A/D converter 18 cause A/D converter 18 to make its conversions at different quantization levels. Thus, by changing Vref, processor 20 can change the resolution level used by A/D converter 18.

Therefore, in the embodiment shown in FIG. 6, programmable reference voltage 80 is illustratively comprised of a plurality of different, selectable voltage taps that can be selected by processor 20. Each tap corresponds to a different voltage level that is provided, when selected, as the Vref input to A/D converter 18. In this way, processor 20 can dynamically adjust the quantization level (resolution) with which A/D converter 18 operates, based on the value of the measured input signal 24.

Figure 7:
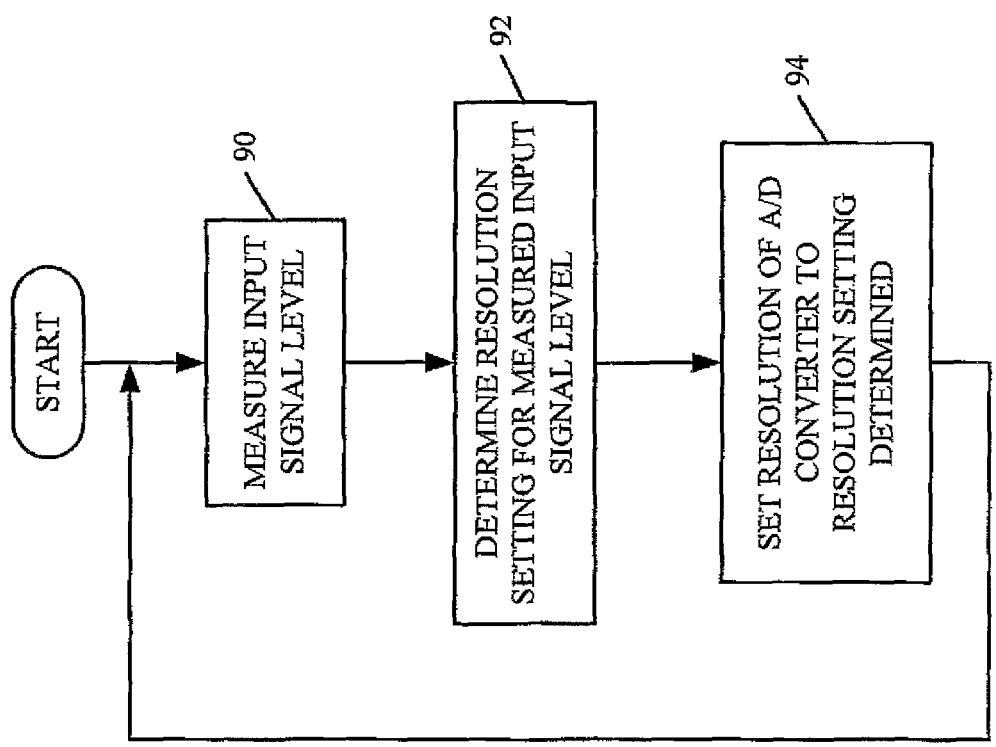
FIG. 7 is a simplified flow diagram illustrating one embodiment of the operation of the system.

FIG. 7 is a simplified flow diagram illustrating one embodiment of the operation of transmitter 10. In the embodiment shown in FIG. 7, transmitter 10 first measures the input signal level of sensor input 24. This is indicated by block 90. Processor 20 then determines the appropriate resolution setting based on the measured sensor input signal level by determining which resolution zone signal 24 falls in. This is indicated by block 92. Processor 20 then sets the resolution of A/D converter to the resolution setting that matches the resolution zone it determined in block 92. This is indicated by block 94. The particular way in which processor 20 controls transmitter 10 to dynamically adjust the resolution of A/D converter 18 will depend on the particular embodiment used for that adjustment. A number of exemplary embodiments are discussed above with respect to FIGS. 1-6. It will be appreciated that FIG. 7 is but one exemplary method of operating transmitter 10.

Although the present invention has been described with reference to preferred embodiments, workers skilled in the art will recognize that changes may be made in form and detail without departing from the spirit and scope of the invention.

What is claimed is:

1. A method of controlling an analog-to-digital (A/D) converter in a process variable transmitter that converts an analog input signal indicative of an industrial process variable to a digital output signal, the method comprising:

receiving the analog input signal indicative of the industrial process variable;

measuring a signal level of the analog input signal;

intermittently matching a resolution setting for the A/D converter to the measured signal level for the analog input, based on the measured signal level for the analog input signal, such that the A/D converter converts the analog input signal to the digital output signal with a highest resolution obtainable from the A/D converter, given the measured signal level of the analog input signal;

converting the analog input signal to the digital output signal using the matched resolution setting; and sending information related to the industrial process variable over a transmission connection.

2. The method of claim 1 wherein the highest resolution obtainable from the A/D converter changes as the measured level of the analog input signal varies among a plurality of different signal ranges, and wherein intermittently matching comprises:

measuring the signal level of the analog input signal; and if the measured signal level crosses a threshold corresponding to a boundary between one of the plurality of different signal ranges and another of the plurality of different signal ranges, changing the resolution setting for the A/D converter to correspond to the other of the plurality of different signal ranges.

3. The method of claim 2 wherein changing the resolution setting is performed using hysteresis such that the resolution setting is only changed if the measured signal level crosses the threshold by a predetermined amount.

4. The method of claim 2 wherein the resolution setting for the A/D converter comprises an adjustable gain setting that sets a resolution set-point to be indicative of a portion of a voltage reference potential input to the A/D converter, and wherein intermittently matching the resolution setting comprises:

intermittently changing the adjustable gain setting to vary the resolution set-point based on the measured level of the analog input signal.

5. The method of claim 2 wherein the resolution of the A/D converter changes based on a reference voltage applied to the A/D converter and wherein changing the resolution setting comprises:

changing the reference voltage applied to the A/D converter.

6. The method of claim 1 wherein the highest resolution obtainable from the A/D converter changes as the measured level of the analog input signal varies among a plurality of different signal ranges, and wherein intermittently matching comprises:

measuring the signal level of the analog input signal; and if the measured signal level crosses a threshold corresponding to a boundary between a higher resolution range of the plurality of different signal ranges and a lower resolution range of the plurality of different signal ranges, introducing a signal offset into the signal level of the analog input signal to keep the measured signal level in the higher resolution range.

7. The method of claim 1 wherein intermittently matching comprises:

determining whether the measured signal level has entered a window around a boundary between one of the plurality of different signal ranges and another of the plurality of different signal ranges.

8. The method of claim 7 wherein intermittently matching comprises:

changing the resolution setting for the A/D converter to correspond to the other of the plurality of different signal ranges even if the measured signal level is still within the one of the plurality of different signal ranges, as long as the measured signal level has entered the window.

9. The method of claim 8 wherein changing the resolution setting comprises:
changing the resolution setting for the A/D converter to correspond to the other of the plurality of different signal ranges, even if the measured signal level is still within the one of the plurality of different signal ranges, as long as the measured signal level has entered the window and is approaching the other of the plurality of different signal ranges.

10. The method of claim 9 and further comprising:
measuring a rate of change of the measured signal level; and
changing the resolution setting for the A/D converter to correspond to the other of the plurality of different signal ranges more quickly if the rate of change of the measured signal level is at a first, higher rate, than if the rate of change of the measured signal level is at a second, lower rate.

11. A process variable transmitter that receives a sensor input signal from a sensor that senses a process variable and provides the sensor input signal at an analog signal level indicative of the process variable, comprising:
an analog-to-digital (A/D) converter that converts the sensor input signal to a digital value at a resolution, wherein the resolution obtainable by the A/D converter changes according to a predetermined relationship between the analog signal level of the sensor input signal and a reference voltage provided to the A/D converter; and
a processor, coupled to the VD converter, receiving the digital value and transmitting information over a process control loop based on the digital value, the processor providing a resolution control signal to control the resolution at which the A/D converter provides the digital value by changing at least one of the analog signal level of the sensor input signal or the reference voltage, to match the resolution to the analog signal level of the sensor input signal so the A/D converter provides the digital value at a predetermined resolution, given the analog signal level of the sensor input signal.

12. The process variable transmitter of claim 11 wherein the A/D converter includes an adjustable gain setting that sets a resolution of the A/D converter based a portion of the reference voltage input to the A/D converter.

13. The process variable transmitter of claim 12 wherein the processor matches the resolution to the analog signal level by changing the adjustable gain setting to vary the resolution based on the measured level of the analog input signal.

14. The process variable transmitter of claim 11 wherein the reference voltage provided to the A/D converter is programmable by the processor and wherein the processor matches the resolution to the sensor input signal by programming a given reference voltage to obtain a given resolution based on the digital value of the sensor input signal.

15. The process variable transmitter of claim 11 and further comprising:
an input signal normalizer component, coupled to the processor and the sensor, that introduces an offset into the analog signal level of the sensor input signal.

16. The process variable transmitter of claim 15 wherein the processor controls the input signal normalizer component to introduce the offset into the analog signal level of the sensor input signal when introduction of the offset increases the resolution of the A/D converter over a resolution of the A/D converter without the offset introduced into the analog signal level.

17. The process variable of claim 11 wherein the processor matches the resolution to the analog signal level of the sensor input signal so the A/D converter provides the digital value at a highest possible resolution, given the analog signal level of the sensor input signal.

18. The process variable of claim 11 wherein the processor matches the resolution to the analog signal level of the sensor input signal so the A/D converter provides the digital value at a highest possible resolution, given the analog signal level of the sensor input signal, each time the A/D converter converts the sensor input signal to a digital value.

19. A method of controlling a process variable transmitter, the method comprising:
receiving, from a sensor, an analog input signal indicative of an industrial process variable;
measuring a signal level of the analog input signal by using an analog-to-digital (A/D) converter that converts the analog input signal to a digital output signal;
varying a resolution setting for the A/D converter, based on the measured signal level for the analog input, to configure the A/D converter to convert the analog input signal to the digital output signal with a highest resolution obtainable from the A/D converter, given the measured signal level of the analog input signal;
converting the analog input signal to the digital output signal using the varied resolution setting; and
sending information related to the industrial process variable over a transmission connection comprising one of a hardwired process control loop and a wireless connection.

20. The method of claim 19 wherein varying a resolution setting comprises:
automatically changing a signal level of the analog input signal by a predetermined amount based on the measured signal level for the analog input signal.

* * * * *